United States Patent [19]
Urakami et al.

[11] Patent Number: 5,317,577
[45] Date of Patent: May 31, 1994

[54] OPTICAL WAVELENGTH SHIFTER USING NONLINEAR REFRACTIVE MEDIUM DISPOSED INTERIORLY OF LASER RESONATOR

[75] Inventors: Tsuneyuki Urakami; Shinichiro Aoshima, both of Hamamatsu, Japan

[73] Assignee: Hamamatsu Photonics K.K., Shizuoka, Japan

[21] Appl. No.: 895,130

[22] Filed: Jun. 8, 1992

Related U.S. Application Data

[63] Continuation-in-part of Ser. No. 826,061, Jan. 27, 1992.

[30] Foreign Application Priority Data

Jan. 25, 1991 [JP] Japan .................. 3-25770
Jun. 6, 1991 [JP] Japan .................. 3-167370

[51] Int. Cl.$^5$ .............................. H01S 3/10
[52] U.S. Cl. .................... 372/21; 372/700; 372/100; 372/9; 372/26; 372/92; 359/328
[58] Field of Search ............ 372/9, 21, 22, 26, 31, 372/92, 700, 100

[56] References Cited

U.S. PATENT DOCUMENTS

| | | |
|---|---|---|
| 4,588,957 | 5/1986 | Balant et al. |
| 4,791,631 | 12/1988 | Baumert et al. ............ 372/21 |
| 4,884,277 | 11/1989 | Anthon et al. ............. 372/21 |
| 4,907,235 | 3/1990 | Kuizenga .................. 372/21 |
| 5,054,027 | 10/1991 | Goodberlet et al. ........ 372/25 |

FOREIGN PATENT DOCUMENTS

| | | |
|---|---|---|
| 0301803 | 2/1989 | European Pat. Off. |
| 2553204 | 10/1983 | France. |
| 8500472 | 1/1985 | PCT Int'l Appl. |
| 9002429 | 3/1990 | PCT Int'l Appl. |

OTHER PUBLICATIONS

Appl. Phys. Lett. 52 (23), Jun. 6, 1988, "Induced-frequency Shift of Copropagating Ultrafast Optical Pulses" P. L. Baldeck and R. R. Alfano, pp. 1939–1941.
Optics Letters vol. 14, No. 12, Jun. 15, 1989, "Additive-pulse Mode-locked NaCl:OH-Laser" Christopher P. Yakymyshyn, et al., pp. 621–623.
Optics Letters, vol. 14, No. 1, Jan. 1, 1989, "Femtosecond Pulse Generation in a Laser with a Nonlinear External Resonator" J. mark, et al., pp. 48–50.

Primary Examiner—Léon Scott, Jr.
Attorney, Agent, or Firm—Sughrue, Mion, Zinn, Macpeak & Seas

[57] ABSTRACT

An optical wavelength shifter shifts a wavelength of light over a wide range without need for using a large peak pump pulse. A nonlinear optical medium having a nonlinear refractive index is disposed interiorly of a laser resonator. A pump pulse and a light to be modulated are incident on a nonlinear optical medium to phase shift the light. With the provision of a timing delay unit, the timing at which the light to be modulated is incident on the nonlinear optical medium is delayed with respect to the timing at which the pump pulse is incident thereon.

8 Claims, 4 Drawing Sheets

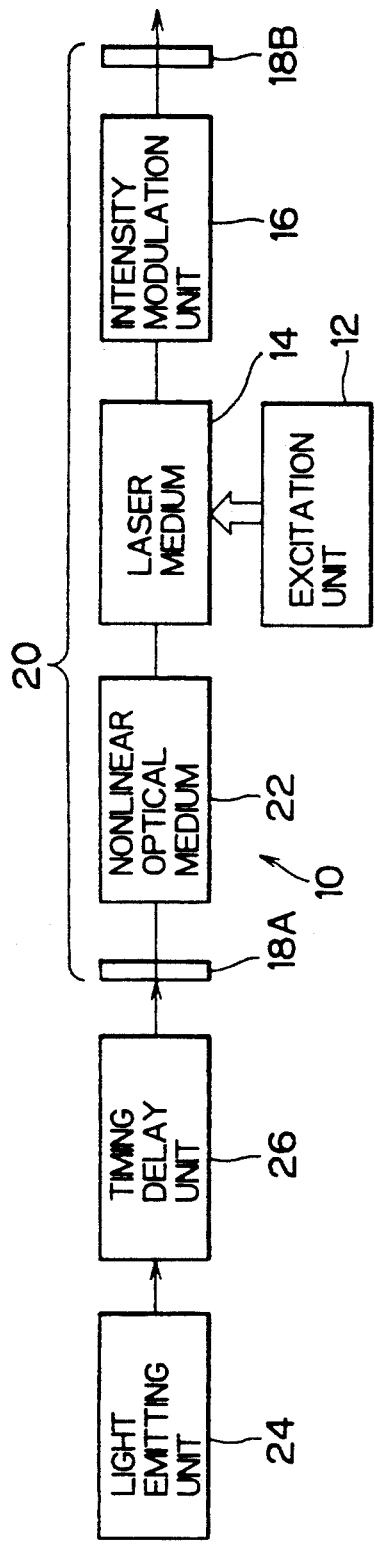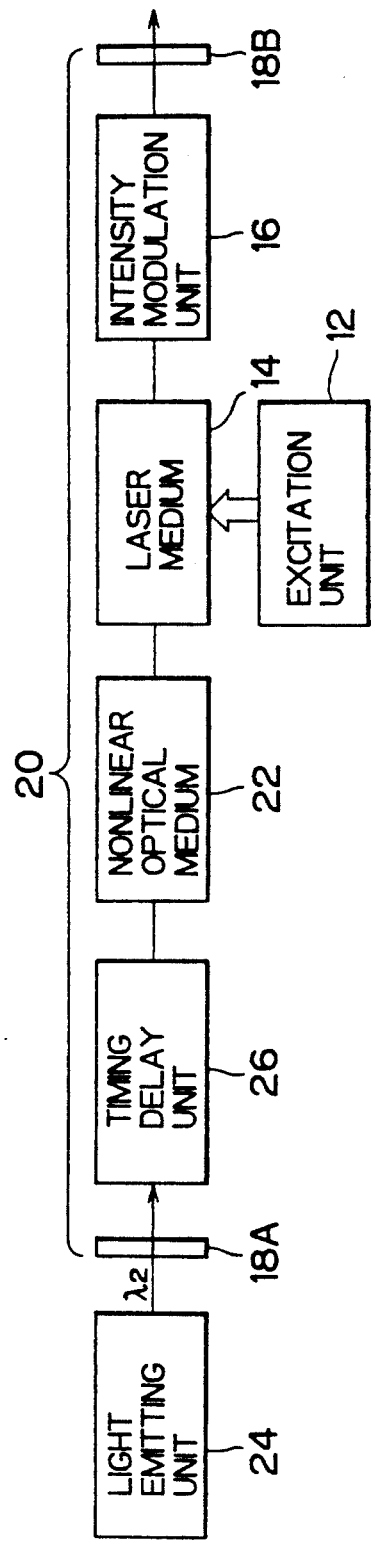

$\theta_B$ : BREWSTER ANGLE

OPTICAL WAVELENGTH SHIFTER USING NONLINEAR REFRACTIVE MEDIUM DISPOSED INTERIORLY OF LASER RESONATOR

CROSS REFERENCE TO RELATED APPLICATION

This application is a continuation-in-part application of Ser. No. 07/826,061 filed Jan. 27, 1992.

BACKGROUND OF THE INVENTION

1. Field of the Invention

The present invention relates to an optical wavelength shifter, and more particularly to an optical wavelength shifter for shifting the wavelength of light by varying timings at which the light and a pump pulse are incident on a nonlinear refractive medium 2. Description of the Prior Art Intense, ultrafast, and broad-spectral-width pulses close to white-light called continuum or supercontinuum are generated by passing picosecond laser pulses through a nonlinear refractive medium having a nonlinear refractive index.

For spectral broadening, it has been known to utilize a phase modulation wherein the spectral range of the laser is broadened when the laser pulse passes through a nonlinear refractive medium. As the laser pulse passes through the medium, it causes a refractive index change. This in turn induces a phase change which causes a frequency sweep within the pulse envelope. This is called self phase modulation (SPM). Induce phase modulation (IPM) and cross phase modulation (XPM) are also known in the art. In IPM, a phase modulation is performed using an intense laser pulse serving as pump pulse. More specifically, when a weak pulse of a different frequency passes through the medium whose refractive index was changed by the intense laser pulse, the phase of the weak optical field can be modulated by the time variation of the index of refraction originating from the primary intense pulse.

Similarly, in XPM, light is phase shifted when a pump pulse and the light to be modulated are simultaneously incident on the nonlinear refractive medium, wherein the phase shift depends on the peak power of the pump pulse. A differential of the phase shift corresponds to a frequency modulation, hence the phase modulation is equivalent to the frequency modulation. Consequently, the spectrum of light can be broadened or an optical wavelength can be changed through the phase modulation by way of XPM. As disclosed in a paper entitled "Induced-frequency shift of copropagating ultrafast optical pulses" by P. L. Baldeck et al, announced in "American Institute of Phys" published Jun. 6, 1988, it has been known that the central wavelength is shifted caused by the change of a timing at which the pump pulse and the light to be modulated are incident on the nonlinear refractive medium. Since the phase modulation depends on the peak power of the pump pulse in XPM, there is a problem that a large peak power pump pulse is required.

SUMMARY OF THE INVENTION

The present invention has been made to solve the above problem, and according it is an object of the present invention to provide an optical wavelength shifter in which an optical wavelength shift is performed on light, over an extensive range of frequency without using pulses having a high level peak power.

To achieve the above and other objects, the present invention provides an optical wavelength shifter including a laser resonator, a nonlinear optical medium disposed interiorly of the laser resonator so that the pump pulse is incident on the nonlinear optical medium, light emitting means for emitting light to be modulated, and timing delay means disposed to receive the light emitted from the light emitting means and to apply the light into the nonlinear optical medium upon delaying the light by a desired period of time. The laser resonator has a first laser mirror, a second laser mirror, a laser medium disposed between the first and second laser mirrors, and exciting means for exciting the laser medium to produce the pump pulse from the laser medium. The nonlinear optical medium has a nonlinear refractive index and is disposed between the first laser mirror and the laser medium.

The timing delay means may be disposed interiorly of the laser resonator to be positioned between the first laser mirror and the nonlinear optical medium. The light emitting means may further be disposed interiorly of the laser resonator to be positioned so that the light emitting means and the timing delay means are disposed between the first laser mirror and the nonlinear optical medium in the stated order.

BRIEF DESCRIPTION OF THE DRAWINGS

The particular features and advantages of the invention as well as other objects will become apparent from the following description taken in connection with the accompanying drawings, in which:

FIG. 1 is a block diagram showing an optical waveform shifter according to a first embodiment of the present invention;

FIG. 2 is a block diagram showing an optical waveform shifter according to a second embodiment of the present invention;

DETAILED DESCRIPTION OF THE PREFERRED EMBODIMENTS

Figure 3:
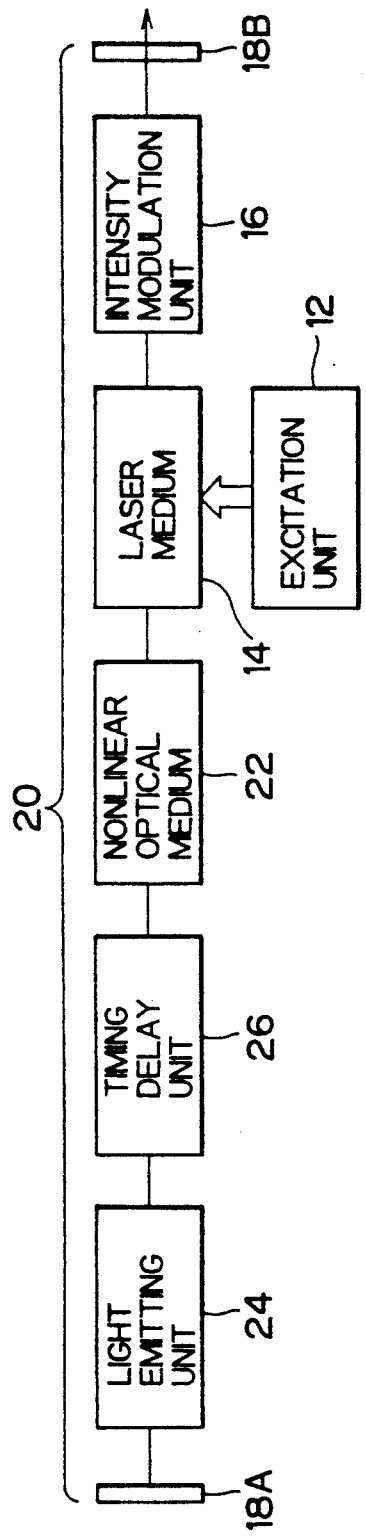
FIG. 3 is a block diagram showing an optical waveform shifter according to a third embodiment of the present invention.

A first embodiment of an optical wavelength shifter 10 is shown in block form in FIG. 1. The wavelength shifter 10 includes a laser resonator 20, a nonlinear optical medium having a nonlinear refractive index, a light emitting unit 24, and a timing delay unit 26. The laser resonator 20 includes an input laser mirror 18A, an output laser mirror 18B, a laser medium 14, and an excitation unit 12 for exciting the laser medium 14. The nonlinear optical medium 22 whose refractive index changes when laser pulses pass therethrough is disposed interiorly of the laser resonator 20. In the embodiment shown in the figure, the nonlinear optical medium 22 is disposed between the input laser mirror 18A and the laser medium 14. An intensity modulation unit 16 may optionally be disposed between the laser medium 14 and the output laser mirror 18B. With such an arrangement, the light emitted from the unit 24 and the pump pulse are incident on the nonlinear optical medium 22 to thereby phase modulate the light. The timing delay unit 26 delays a timing at which the light to be modulated is incident on the nonlinear optical medium 22 to thereby shift the wavelength of the light.

The input and output laser mirrors 18A, 18B have high transmissivity for the wavelength $\lambda 2$ of the light emitted from the light emitting unit 24 and high reflectivity against the wavelength $\lambda 1$ of the light oscillated from the laser medium 14.

Laser diode, solid laser, dye laser, or gas laser are usable for the laser resonator 20. The two end faces of the laser diode, when used for the laser resonator 20, needs to be coated with a material having a high transmissivity to the light to be modulated and a small transmissivity to the pump pulse oscillated in the laser resonator 20.

For the excitation unit 12, various kinds of lasers or flash lamps are usable in the case of photo-excitation, a current producing unit is usable in the case of current excitation, and a discharge generation unit is usable in the case of discharge excitation.

Semiconductor, solid, liquid and gaseous materials are usable for the laser medium 14. Typically, semiconductor materials, such as GaAs, InGaAsP, InAlP, solid materials, such as Nd-YAG, YLF, $Cr^{3+}:Mg_2SiO_4$, $Cr^{4+}:Mg_2SiO_4$, and fibers, liquid materials, such as Rhodamine6G, gases materials, such as argon, excimer, $CO_2$, copper vapor, are usable.

The nonlinear optical medium 22 is selected from the materials having a nonlinear refractive index. Such materials include, for example, hydrogen, water ($H_2O$, $D_2O$), acetone, cyclohexanone, nitrogen, oxygen, nitrobenzene, toluene, chlorobenzene, bromobenzene, benzene, $CS_2$, $CCl_4$, diamond, calcite, silicon, rock crystal, $LiTaO_3$, InSb, optical fiber and the like.

The intensity modulation unit 16 can be selected from a Q-switch, cavity dumper, mode-locker, and passive mode locking owing to a saturable absorption dye, all of which are well known in the art. For the laser medium 14 made of a semiconductor material, the intensity modulation unit 16 can be dispensed with by using an excitation current pulse.

For the Q-switch constituted with an A/O element or E/O element, the laser medium 14 is excited under the condition where the Q factor is lowered, and then the Q factor is abruptly increased when the population inversion density has become sufficiently large, to thereby obtain an intense, ultrashort duration laser output.

For the cavity dumper used for the intensity modulation unit 16, the laser output is pulsated while instantaneously taking out the energy stored in the interior of the laser resonator 20 through diffraction.

For the mode-locker used for the intensity modulation unit 16, an A/O element or E/O element is incorporated in the interior of the laser resonator 20 to forcibly synchronize the phases of a plurality of simultaneously oscillating longitudinal modes using an electrical signal applied from externally.

When the intensity modulation unit 16 is operating in the passive mode locking by the use of an absorbable dye, the absorbable dye absorbs the weak light to thereby further weaken the light but little absorbs the intense light and remains such light substantially the same.

It should be noted that the excitation unit 12 can also be used as the intensity modulation unit 16. Specifically, in the case of light excitation, the excitation unit 12 pulsates the excited light, and in the case of current excitation, the excitation is performed by a pulsating current. A hybrid arrangement in which these excitation means 6 are combined can be adopted.

As the light emitting unit 24, light sources of various kinds of lasers or LEDs can be used.

In operation, since the input and output laser mirrors 18A, 18B have high reflectivity against the wavelength $\lambda 1$ of light oscillated from the excited laser medium 14, the wavelength $\lambda 1$ light is resonated between the input and output laser mirrors 18A, 18B and pulse light is produced from the intensity modulating unit 16. On the other hand, the light of wavelength $\lambda 1$ emitted from the light emitting unit 24 is introduced into the laser resonator 20 through the timing delay unit 26. The light can easily be introduced into the laser resonator 20 and derived from the laser resonator 20, since the input and output laser mirrors 18A, 18B have high transmissivity to the light of wavelength $\lambda 2$.

The light of wavelength $\lambda 2$ and the pump pulse of wavelength $\lambda 1$ are simultaneously incident on the nonlinear optical medium 22, where the light of wavelength $\lambda 2$ is subjected to phase modulation. The phase modulated light is outputted from the output laser mirror 18B. The timing delay unit 26 delays the incident timing of the light to be modulated, so that the light is undergone the wavelength shift.

P. L. Baldeck et al reported in the paper mentioned previously that about 0.45 nm wavelength shift was observed in an experiment using as the pump pulse a laser light whose peak power is 4 kw. In the case of using the pump pulse of the same peak power in the present invention, the peak power contributed to XPM is 100 times as large as the peak power reported in that paper, assuming that the transmissivity of the mirrors of the laser resonator is about 1%. Therefore, the wavelength can be shifted in a range of 45 nm.

A waveform shifter according to a second embodiment of the present invention is shown in FIG. 2. The second embodiment is similar in arrangement to the first embodiment except that the timing delay unit 26 is disposed between the input mirror 18A and the nonlinear optical medium 22.

A waveform shifter according to a third embodiment of the present invention is shown in FIG. 3. The third embodiment is also similar to the first embodiment except that both the light emitting unit 24 and the timing delay unit 26 are disposed interiorly of the laser resonator 20. The input laser mirror 18A has a high reflectivity against the light of wavelengths $\lambda 1$ and $\lambda 2$. The output mirror 18B, on the other hand, has a high transmissivity to the light of wavelength $\lambda 2$ and high reflectivity against the light of wavelength $\lambda 1$.

In the third embodiment, the light emitting unit 2a may be arranged so as to perform waveform conversion of a part of the laser light of wavelength $\lambda 2$ which has been oscillated in the laser resonator 20 and to produce a light of wavelength λ1 which is an SHG (second harmonic generation) of the light of wavelength λ2. To effect the waveform conversion, ADP, KDP, β-BaBO$_4$ are available, whereby SHG light, THG (third harmonic generation) light, FHG (fifth harmonic generation) light or parametric oscillation light are obtainable. Hence, in such cases, it is not necessary to actuate the light emitting unit 24 by other means. Further, the power loss of the light to be modulated can be suppressed.

Figure 4:
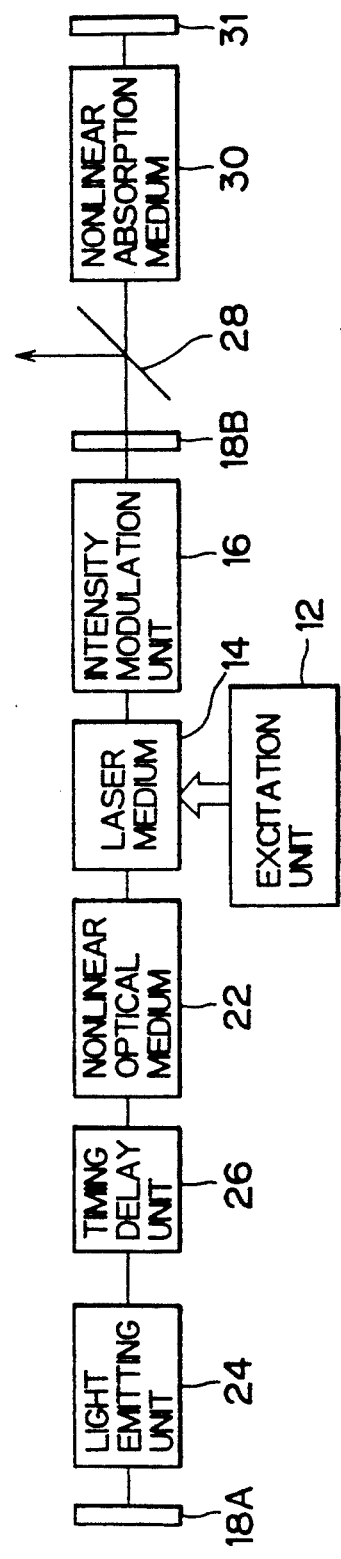
FIG. 4 is a block diagram showing an optical waveform shifter according to a fourth embodiment of the present invention.

A fourth embodiment of the present invention is shown in FIG. 4. The fourth embodiment is similar to the third embodiment shown in FIG. 3 but is different therefrom in that the fourth embodiment further includes a dichoroic mirror 28, a nonlinear absorption medium 30, and a total reflection mirror 31 disposed in the stated order at the exterior of the output laser mirror 18B. The dichroic mirror 28 has a high reflectivity against the light of wavelength λ2, whereby the light reflected from the dichroic mirror 28 can be derived as the output light. The transmissivity of the output laser mirror 18B for the light of wavelength λ1 has been set to large. The pump light is subjected to intensity modulation through additive mode-lock by the nonlinear absorption medium 30 and the total reflection mirror 31. The intensity modulation unit can be dispensed with.

Figure 5:
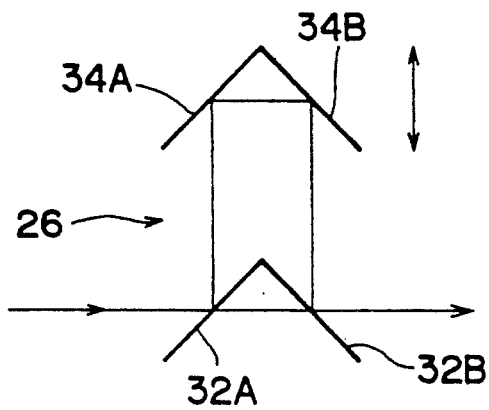
FIG. 5 is an explanatory diagram showing a first example of a timing delay unit usable in the embodiments of the present invention.
Figure 6:
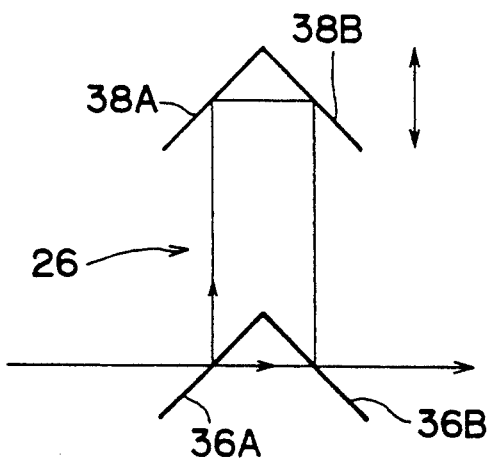
FIG. 6 is an explanatory diagram showing a second example of the timing delay unit usable in the embodiments of the present invention.
Figure 7:
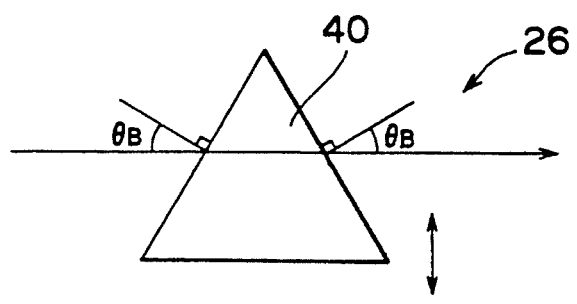
FIG. 7 is an explanatory diagram showing a third example of the timing delay unit usable in the embodiments of the present invention.

The timing delay unit 26 used in the various embodiments has an arrangement shown in FIGS. 5 through 7. In the cases where the light emitting unit 24 is disposed exteriorly of the laser resonator 20 as in the first and second embodiments shown in FIGS. 1 and 2, the timing delay unit 26 can be arranged as shown in FIG. 5. A pair of mirrors 32A, 32B are arranged at ±45° with respect to an optical axis, and another pair of mirrors 34A, 34B which are in parallel to the mirrors 32A, 32B are movably disposed toward and away from the mirrors 32A, 32B in the direction perpendicular to the optical axis while keeping the parallelism of the two pairs of the mirrors. By the movement of the mirrors 34A, 34B, the optical path length is changed to thus yield a delay of light. A material having a high refractive index such as glass may be provided in the optical path or the length of an optical fiber arranged on the optical axis may be changed.

For the cases where the light emitting unit 24 is disposed interiorly of the laser resonator 20 as in the embodiments shown in FIGS. 3 and 4, the timing delay unit 26 may be arranged as shown in FIG. 6. In the figure, a pair of dichroic mirrors 36A, 36B are arranged at ±45° with respect to the optical axis, which are transmissive of the light of wavelength of λ1 and reflective of the light of wavelength λ2 or vice versa. A pair of mirrors 38A, 38B arranged in parallel to the dichroic mirrors 36A, 36B are movably disposed toward and away from the dichroic mirrors 36A, 36B.

Figure 8:
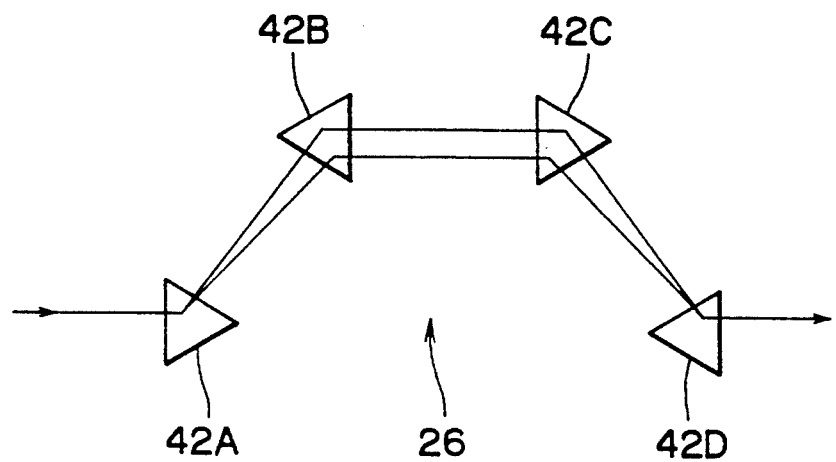
FIG. 8 is an explanatory diagram showing a fourth example of the timing delay unit usable in the embodiments of the present invention.
Figure 9:
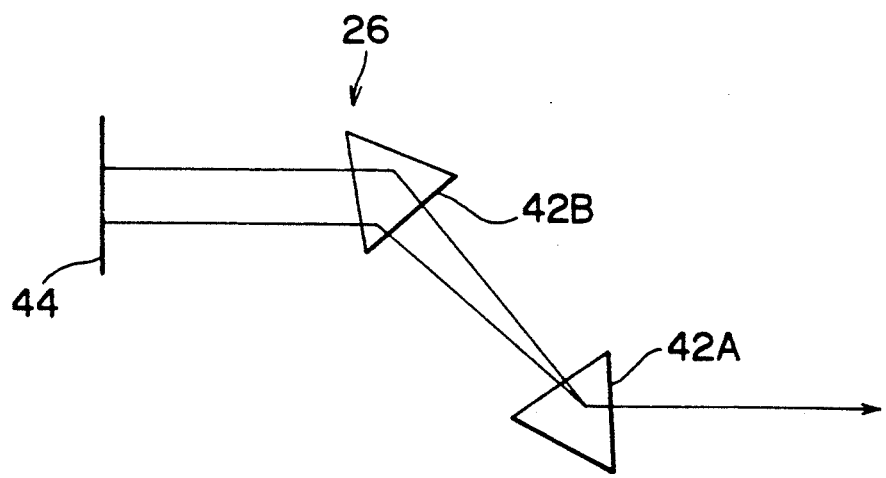
FIG. 9 is an explanatory diagram showing a fifth example of the timing delay unit usable in the embodiments of the present invention.

As a further example of the timing delay unit 26, a medium 40 having different refractive indices with respect to lights of wavelengths λ1 and λ2 may be movably disposed in the laser resonator 20. The effective optical path lengths of the lights of λ1 and λ2 can be changed with the use of prisms 42A, 42B, 42C and 42D arranged as shown in FIG. 8 or with the use of prisms 42A, 42B and a mirror 44 arranged as shown in FIG. 9. By moving the positions of the prisms 42B and 42C, the optical path lengths of the lights passing through the medium, i.e., prism, are changed to thereby differentiate the optical path lengths.

In the embodiments described, the light to be modulated can be formed into short pulses and a pulse width varying function can be achieved by the provision of a correction arrangement, such as grating pair, for correcting a phase dispersion on each wavelength to the interior of the laser resonator 20 or the laser medium 14.

Although the laser medium 14 and the nonlinear optical medium 22 are separately provided, the nonlinear medium 22 is not required if the laser medium 14 has a nonlinear refractive index.

The intensity of light within the laser resonator is greater by one or two orders than the intensity of light extracted out of the laser resonator, so that a high peak power pump pulse can be incident on the nonlinear optical medium. Thus, the wavelength shift can be correspondingly increased, since the wavelength shift depends on the peak power of the pump pulse.

What is claimed is:

1. An optical wavelength shifter comprising:
   a laser resonator having a first laser mirror, a second laser mirror, a laser medium disposed between said first and second laser mirrors, and exciting means for exciting said laser medium to produce a pump pulse from said laser medium;
   a nonlinear optical medium having a nonlinear refractive index for modulating light having a phase and a wavelength, said nonlinear optical medium being disposed interiorly of said laser resonator so that the pump is incident on said nonlinear optical medium;
   light emitting means for emitting said light to be modulated by said nonlinear optical medium; and
   timing delay means, disposed between said light emitting means and said nonlinear optical medium, for receiving said light emitted from said light emitting means and for transmitting said light to said nonlinear optical medium after delaying said light by a desired period of time,
   wherein the application of the pump pulse upon said nonlinear optical medium causes said refractive index of said nonlinear optical medium to change, thereby causing said nonlinear optical medium to modulate the phase of said light and to thus shift the wavelength of said light,
   and wherein said nonlinear optical medium is disposed between said light emitting means and said laser medium.

2. The optical wavelength shifter according to claim 1, wherein said nonlinear optical medium is disposed between said first laser mirror and said laser medium.

3. The optical wavelength shifter according to claim 2, wherein said timing delay means is disposed interiorly of said laser resonator positioned between said first laser mirror and said nonlinear optical medium.

4. The optical wavelength shifter according to claim 1, wherein said timing delay means and said light emitting means are disposed interiorly of said laser resonator, positioned so that said light emitting means and said timing delay means are disposed between said first laser mirror and said nonlinear optical medium.

5. The optical wavelength shifter according to claim 4, wherein said light emitting means produces said light by shifting a wavelength of a part of the pump pulse.

6. The optical wavelength shifter according to any one of the preceding claims, further comprising an intensity modulating means disposed interiorly of said laser resonator for modulating the intensity of the pump pulses oscillated in said laser resonator.

7. The optical wavelength shifter according to claim 5, further comprising:
   an intensity modulating means, disposed interiorly of said laser resonator and adjacent said second laser mirror, for modulating the intensity of pump pulses oscillated in said laser resonator;
   a dichroic mirror, disposed exteriorly of said laser resonator and adjacent said second laser mirror, for reflecting modulated light away from said laser resonator;
   a nonlinear absorbing medium disposed next to said dichroic mirror; and
   a reflecting mirror disposed next to said nonlinear absorbing medium,
   wherein said nonlinear absorbing medium and said reflecting mirror further modulate said pump pulses.

8. The optical wavelength shifter according to any one of claims 1-5 and 7, wherein said timing delay means comprises means for changing an optical path length of said light emitted from said light emitting means.

* * * * *